United States Patent
Van Herpen et al.

(10) Patent No.: US 7,706,057 B2
(45) Date of Patent: *Apr. 27, 2010

(54) SPECTRAL PURITY FILTER FOR A MULTI-LAYER MIRROR, LITHOGRAPHIC APPARATUS INCLUDING SUCH MULTI-LAYER MIRROR, METHOD FOR ENLARGING THE RATIO OF DESIRED RADIATION AND UNDESIRED RADIATION, AND DEVICE MANUFACTURING METHOD

(75) Inventors: Maarten Marinus Johannes Wilhelmus Van Herpen, Heesch (NL); Levinus Pieter Bakker, Helmond (NL); Vadim Yevgenyevich Banine, Helmond (NL); Derk Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/230,384

(22) Filed: Aug. 28, 2008

(65) Prior Publication Data

US 2008/0316595 A1    Dec. 25, 2008

Related U.S. Application Data

(60) Division of application No. 11/337,807, filed on Jan. 24, 2006, now Pat. No. 7,463,413, which is a continuation-in-part of application No. 11/115,406, filed on Apr. 27, 2005, now Pat. No. 7,336,416.

(51) Int. Cl.
*F21V 9/04* (2006.01)
*F21V 9/06* (2006.01)
*G02B 5/08* (2006.01)
*G02B 5/20* (2006.01)

(52) U.S. Cl. .......................... 359/359; 359/584; 355/67
(58) Field of Classification Search ................. 359/359, 359/584–590; 355/67, 71
See application file for complete search history.

(56) References Cited

U.S. PATENT DOCUMENTS 5,958,605 A    9/1999    Montcalm et al.

(Continued)

FOREIGN PATENT DOCUMENTS

| WO | 99/24851 | 5/1999 |
| WO | 2004/053540 A1 | 6/2004 |
| WO | 2004/104707 A1 | 12/2004 |

OTHER PUBLICATIONS

J. H. Underwood, et al., "Layered synthetic microstructures as Bragg diffractors for X rays and extreme ultraviolet: theory and predicted performance", Applied Optics, vol. 20 No. 17 (Sep. 1, 1981).

(Continued)

*Primary Examiner*—Alessandro Amari
(74) *Attorney, Agent, or Firm*—Pillsbury Winthrop Shaw Pittman, LLP

(57) ABSTRACT

A multi-layer mirror includes a multi-layer stack. The multi-layer stack includes a plurality of alternating layers with a multi-layer stack top layer and a spectral filter top layer arranged on the multi-layer stack. The spectral filter top layer includes a first spectral purity enhancement layer that includes a first material m1 and has a first layer thickness d1, an intermediate layer that includes a second material m2 and has a second layer thickness d2. The intermediate layer is arranged on the multi-layer stack top layer. The first material is selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF. The second material includes a material different from the first material, and d1+d2 has a thickness between 1.5 and 40 nm.

23 Claims, 6 Drawing Sheets

U.S. PATENT DOCUMENTS

| | | |
|---|---|---|
| 6,359,969 B1 | 3/2002 | Shmaenok |
| 6,441,963 B2 | 8/2002 | Murakami et al. |
| 6,556,648 B1 | 4/2003 | Bal et al. |
| 6,576,912 B2 | 6/2003 | Visser et al. |
| 6,614,505 B2 | 9/2003 | Koster et al. |
| 6,724,462 B1 * | 4/2004 | Singh et al. .................... 355/53 |
| 7,193,228 B2 | 3/2007 | Bowering et al. |
| 7,336,416 B2 * | 2/2008 | Van Herpen et al. ........ 359/359 |
| 2004/0051954 A1 | 3/2004 | Bristol |
| 2004/0094274 A1 | 5/2004 | Judkins |
| 2004/0105083 A1 | 6/2004 | Kurt et al. |

OTHER PUBLICATIONS

K. M. Skulina et al., "Molybdenum/beryllium multilayer mirrors for normal incidence in the extreme ultraviolet", Applied Optics, vol. 34, No. 19 (Jul. 1, 1995).

European Search Report issued in EP06113136 dated Sep. 1, 2006.

* cited by examiner

SPECTRAL PURITY FILTER FOR A MULTI-LAYER MIRROR, LITHOGRAPHIC APPARATUS INCLUDING SUCH MULTI-LAYER MIRROR, METHOD FOR ENLARGING THE RATIO OF DESIRED RADIATION AND UNDESIRED RADIATION, AND DEVICE MANUFACTURING METHOD

CROSS REFERENCE TO RELATED APPLICATIONS

This application is a divisional application of U.S. application Ser. No. 11/337,807, filed on Jan. 24, 2006 now U.S. Pat. No. 7,463,413, which is a continuation-in-part of U.S. patent application Ser. No. 11/115,406, filed Apr. 27, 2005, now U.S. Pat. No. 7,336,416, issued Feb. 26, 2008, the entire contents of which are both incorporated herein by reference.

BACKGROUND OF THE INVENTION

1. Field of the Invention

The present invention relates to a spectral purity filter for a multi-layer mirror, a lithographic apparatus including such multi-layer mirror, a method for enlarging the ratio of desired radiation and undesired radiation and a device manufacturing method wherein such a multi-layer mirror is used.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation. Such radiation is termed Extreme UltraViolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. In some instances, an EUV source may emit several different wavelengths of light, some of which may be undesired radiation, such as deep ultra-violet radiation (DUV). This non-EUV radiation can, in some instances, be harmful for the EUV lithography system because it can result in a loss of contrast. Thus, it may be desirable to have such undesirable radiation removed by a spectral purity filter (SPF). Present spectral purity filters are based on blazed gratings. These gratings are often difficult to produce, since the surface quality of the triangular shaped pattern should be high. For example, for some gratings the roughness of the surface should be lower than 1 nm RMS. In addition to that, the current spectral purity filter folds the path of the light, which means that it cannot be removed from the system unless another mirror is used to replace the spectral purity filter, thereby causing losses. In order to keep flexibility it may be desirable to be able to remove the spectral purity filter from the system at will, in order to evade the losses caused by the spectral purity filter.

SUMMARY OF THE INVENTION

It is an aspect of the present invention to provide a multi-layer mirror for enlarging the ratio of EUV radiation and DUV radiation, for example for use in a lithographic apparatus. It is a further aspect of the present invention to provide lithographic apparatus including such a multi-layer mirror or including a number of such multi-layer mirrors. It is further an aspect of the present invention to provide a method for enlarging the ratio of EUV radiation and DUV radiation, as well as a device manufacturing method wherein such method is applied.

The present invention provides a multi-layer mirror including on top of the multi-layer mirror a spectral purity enhancement layer, especially for application in an EUV lithographic apparatus. This spectral purity enhancement layer includes at least a first spectral purity enhancement layer, but between the multi-layer mirror and first spectral purity enhancement layer there may be also an intermediate layer or a second spectral purity enhancement layer and intermediate layer. Hence, amongst the embodiments of the present invention there are multi-layer mirrors with the following configurations: multi-layer mirror/first spectral purity enhancement layer; multi-layer mirror/intermediate layer/first spectral purity enhancement layer; and multi-layer mirror/second spectral purity enhancement layer/intermediate layer/first spectral purity enhancement layer. These and other embodiments may enhance the spectral purity of normal incidence radiation, such that DUV radiation is diminished relatively stronger than EUV radiation.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
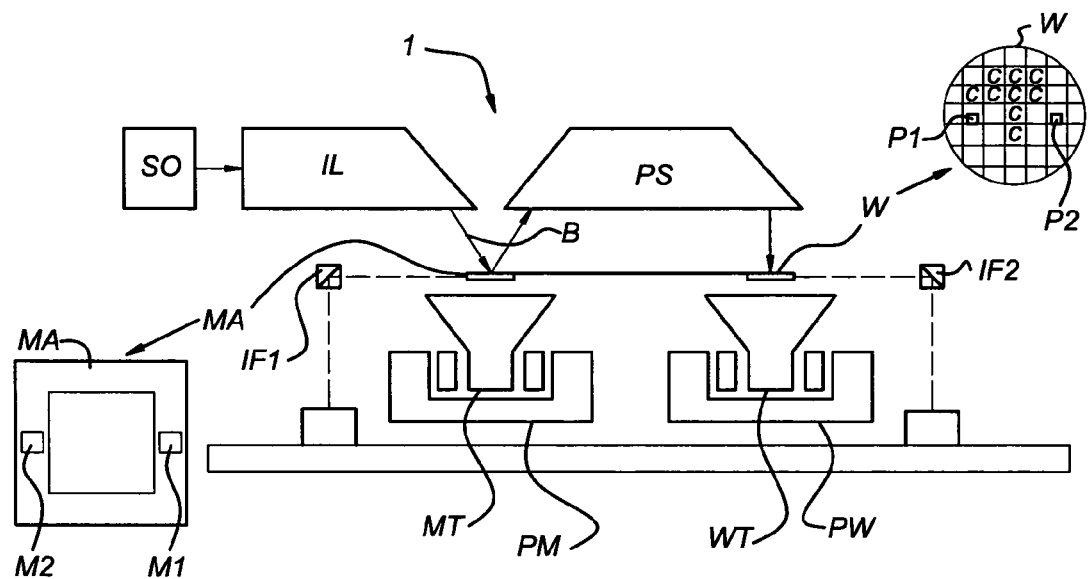
FIG. 1 schematically depicts a lithographic apparatus according to an embodiment of the present invention.

FIG. 1 schematically depicts a lithographic apparatus 1 according to an embodiment of the present invention. The apparatus 1 includes an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory processes may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

The term "layer" used herein, as known to the person skilled in the art, may describe layers having one or more boundary surfaces with other layers and/or with other media like vacuum (in use). However, it should be understood that "layer" may also mean part of a structure. The term "layer" may also indicate a number of layers. These layers can be, for example, next to each other or on top of each other, etc. They may also include one material or a combination of materials. It should also be noted that the term "layers" used herein may describe continuous or discontinuous layers. In the present invention, the term "material" used herein may also be interpreted as a combination of materials.

The terms "radiation" and "beam" used herein encompass all types of electromagnetic radiation, including ultraviolet (UV) radiation (e.g. having a wavelength $\lambda$ of 365, 248, 193, 157 or 126 nm) and extreme ultra-violet (EUV or soft X-ray) radiation (e.g. having a wavelength in the range of 5-20 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, 5-20 nm relates to radiation with a certain wavelength band with, of which at least part of it is found in the range of 5-20 nm.

The indices of refraction herein refer to indices of refraction at a radiation wavelength or within a radiation wavelength range selected from the range of 100-400 nm, for example between 100 and 200 nm.

Figure 2:
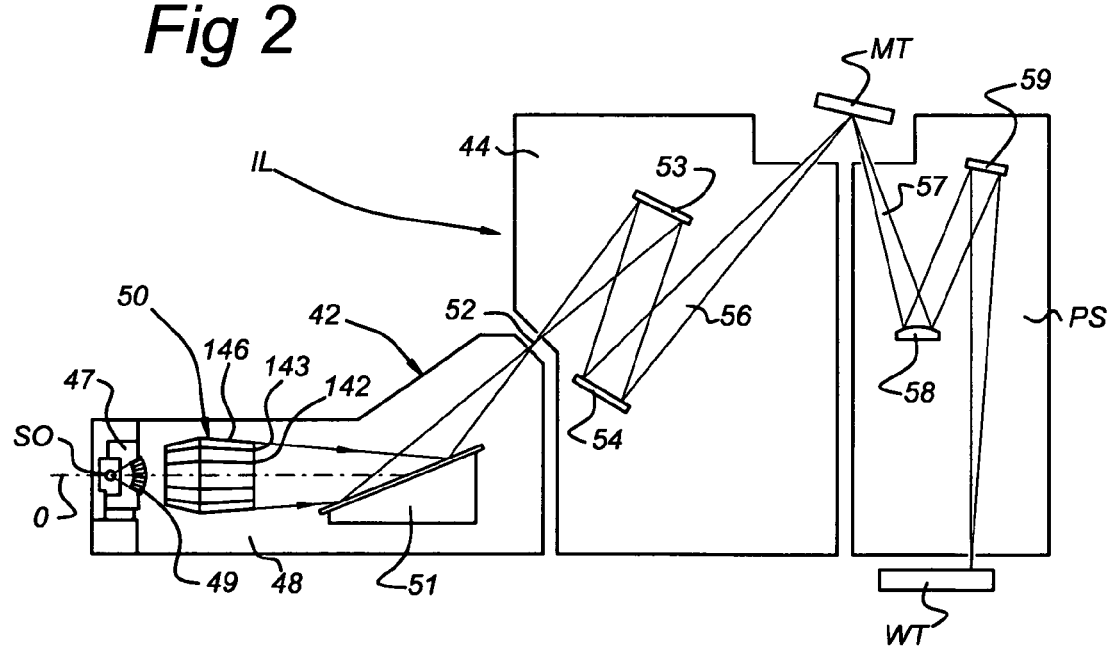
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection optics system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge, as known to the person skilled in the art. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contamination trap 49, which is positioned in or behind an opening in source chamber 47. The gas barrier 49 includes a channel structure such as, for example, described in detail in U.S. Pat. Nos. 6,614,505, 6,359,969 and 6,576,912, and WO 04/104707, which are incorporated herein by reference.

The collector chamber 48 includes a radiation collector 50 which may be formed by a grazing incidence collector. The collector 50 may include several reflectors 142, 143, 146. The reflector 142 is referred to as the inner reflector and the reflector 146 is referred to as the outer reflector. Radiation collectors 50 are known from the prior art. One example of a radiation collector that may be used in the present invention is described, for example in U.S. Patent Application Publication 2004/0094274 A1 (for example in FIGS. 3 and 4), which is incorporated herein by reference.

Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may be present, depending upon the type of lithographic apparatus. Further, there may be more mirrors present than those shown in the figures, e.g. there may be 1-4 more reflective elements be present than 58, 59, as would be appreciated by one skilled in the art, and as described, for example, in U.S. Pat. No. 6,556,648, which is herein incorporated by reference.

The lithographic apparatus as shown in FIGS. 1 and 2 may be a lithographic apparatus, for example an EUV lithographic apparatus, including an illumination system configured to condition a radiation beam; a support configured to support a patterning device, the patterning device being configured to impart the radiation beam with a pattern in its cross-section to form a patterned radiation beam; —a substrate table configured to hold a substrate; a projection system configured to project the patterned radiation beam onto a target portion of the substrate; a source of radiation; and a collector mirror.

In an embodiment the radiation used in the lithographic apparatus and method of the present invention, and collected by the collector mirror 50, includes EUV radiation having a wavelength selected from the range of 5-20 nm, for example 13.5 nm.

Figure 3:
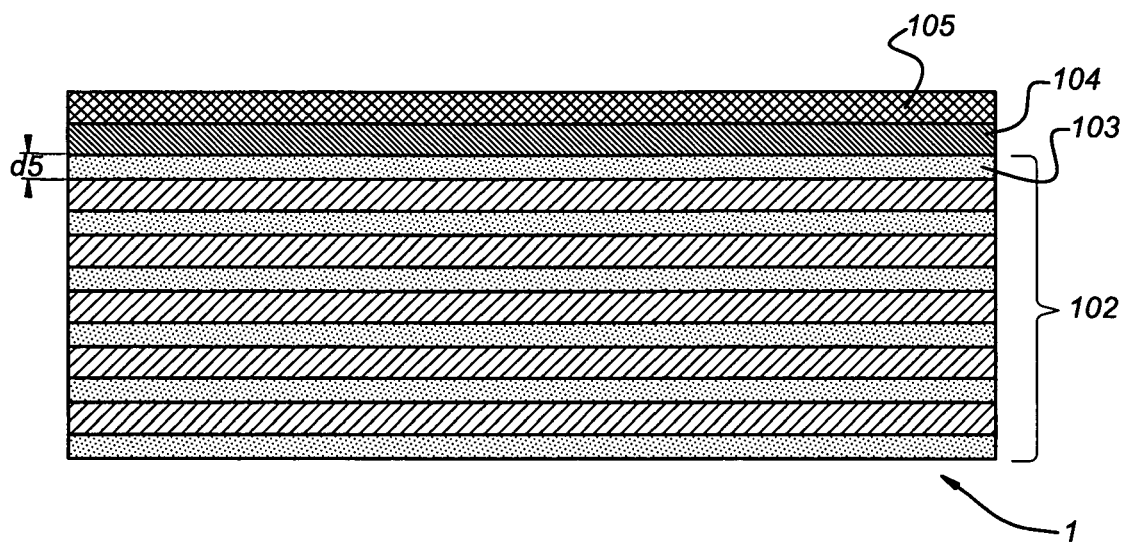
FIG. 3 schematically depicts a multi-layer mirror according to the present invention.

FIG. 3 schematically depicts a multi-layer mirror 100 according to the present invention. The multi-layer mirror 100 includes a multi-layer mirror stack 102, for example including a number of alternating Mo/Si, or W/Si, or WRe/Si, layers. The multi-layer mirror 100, may be a normal incidence mirror. Multi-layer mirrors and normal incidence mirrors are known to the person skilled in the art. Such mirrors are, for example, described in: "Layered synthetic microstructures as Bragg diffractors for X rays and extreme ultraviolet: theory and predicted performance" by J. H. Underwood and T. W. Barbee, Jr., Applied Optics 20, 3027 (1981); "Molybdenum/Beryllium Multilayer Mirrors for Normal Incidence in the Extreme Ultraviolet" by K. M. Skulina, C. S. Alford, R. M. Bionta, D. M. Makowieki, E. M. Gullikson, R. Soufli, J. B. Kortright, and J. H. Underwood, Applied Optics 34, 3727 (1995); and "Soft X-ray Optics" by Eberhard Spiller, SPIE, Bellingham Wash. (1994), which are incorporated herein by reference. The multi-layer stack 102 has a top layer 103, which may be Mo or Si (i.e. one of the layers belonging to the multi-layer stack 102). On top of this multi-layer stack top layer 103 there is provided a spectral purity enhancement layer 104 and optionally an additional cap layer 105. A number of embodiments of the multi-layer mirror according to the present invention are schematically depicted in more detail in FIGS. 4a-c.

Figure 4A:
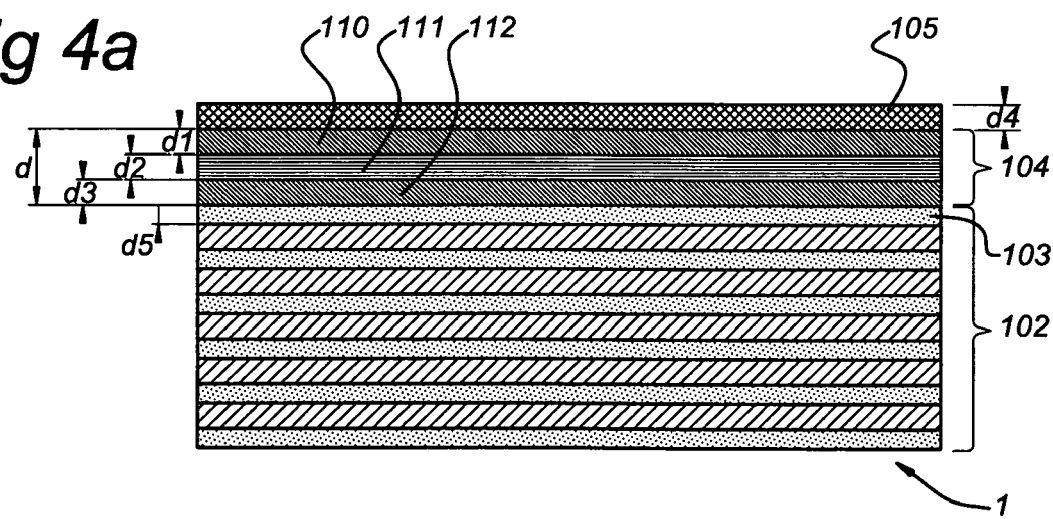
FIGS. 4a-c schematically depict embodiments of the multi-layer mirror according to the present invention.

FIG. 4a schematically depicts a multi-layer mirror according to an embodiment of the present invention, including a) a multi-layer stack 102, the multi-layer stack 102 including a plurality of alternating layers with a multi-layer stack top layer 103, and b) a spectral filter top layer 104 arranged on the multi-layer stack. The spectral filter top layer 104 may include a first spectral purity enhancement layer 110 having a layer thickness d1; an intermediate layer 111 having a layer thickness d2; and a second spectral purity enhancement layer 112 having a layer thickness d3, the second spectral purity enhancement layer being arranged on the multi-layer stack top layer 103. A cap layer 105 may be provided.

Figure 4B:
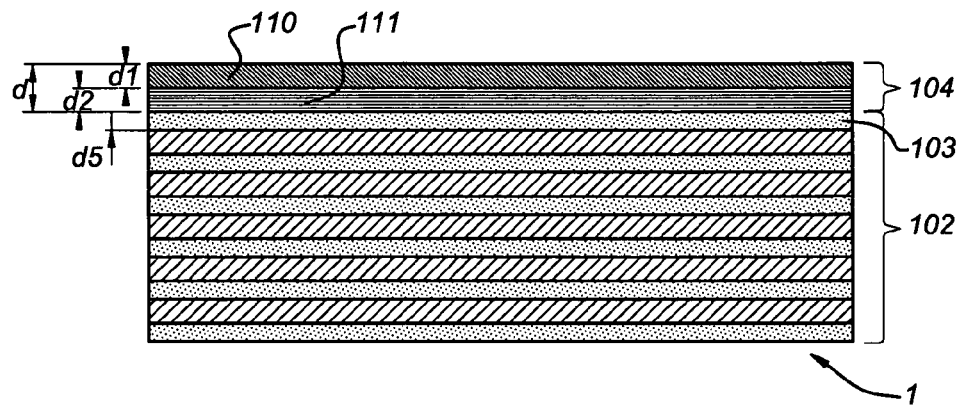

FIG. 4b schematically depicts another embodiment of the multi-layer mirror 100 according to the present invention, including a) a multi-layer stack 102, the multi-layer stack 102 including a plurality of alternating layers with a multi-layer stack top layer 103, and b) a spectral filter top layer 104 arranged on the multi-layer stack. The spectral filter top layer 104 may include a first spectral purity enhancement layer 110 having a layer thickness d1; and an intermediate layer 111 having a layer thickness d2; the intermediate layer 111 being arranged on the multi-layer stack top layer 103.

Figure 4C:
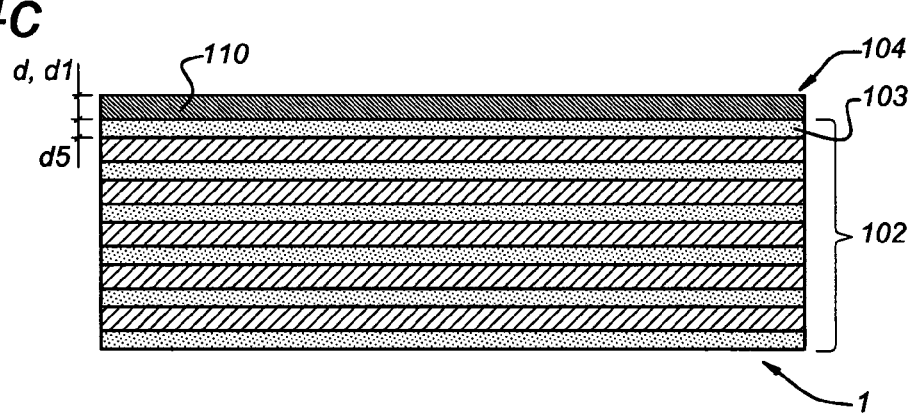

FIG. 4c schematically depicts another embodiment of the multi-layer mirror 100 according to the present invention, including a) a multi-layer stack 102, the multi-layer stack 102 including a plurality of alternating layers with a multi-layer stack top layer 103, and b) a spectral filter top layer 104 arranged on the multi-layer stack. The spectral filter top layer 104 may include a first spectral purity enhancement layer 110 having a layer thickness d1; the first spectral purity enhancement layer 110 being arranged on the multi-layer stack top layer 103.

Using these spectral filter top layers 104, specific bands of radiation frequencies can be filtered out. This provides flexibility, because the amount of suppression can be tuned by varying one or more chosen materials (m1, m2 and m3, respectively), chosen layer thicknesses (d1, d2 and d2, respectively) of the respective layers included in the spectral purity enhancement layer 104, and by choosing the number of multi-layer mirrors that receive such a spectral filter top layer 104. In this way, the required suppression of undesired radiation, for example DUV, can be used, with minimized losses for EUV. Different spectral filter top layers 104 can be used on different mirrors in order to make the suppression broader or stronger.

This will be explained in more detail, referring first to a spectral filter top layer 104 including only a first spectral purity enhancement layer 110, for example as shown in FIG. 4c. Subsequently, two other embodiments are discussed, the former directed to a spectral filter top layer 104 including two spectral purity enhancement layers, separated by an intermediate layer, and the latter directed to a spectral filter top layer 104 including a first spectral purity enhancement layer and an intermediate layer.

Figure 5:
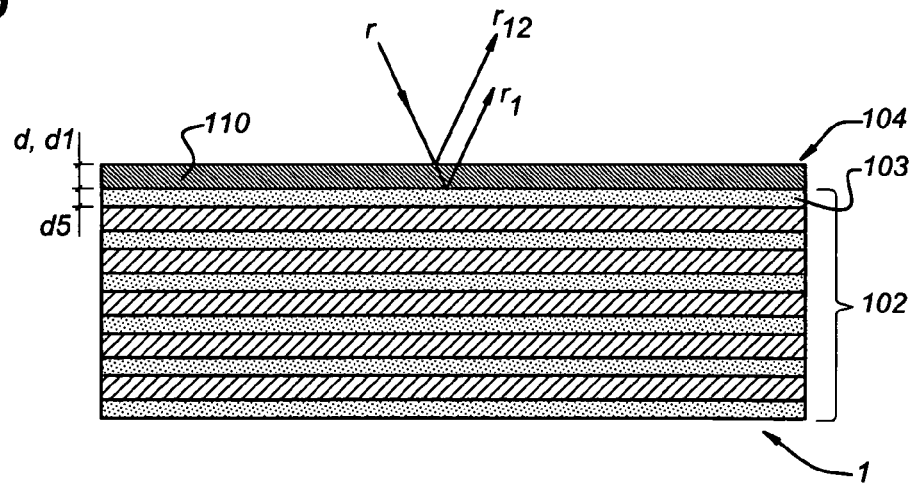
FIG. 5 schematically depicts a multi-layer mirror according to an embodiment of the present invention.

FIG. 5 schematically depicts the multi-layer mirror 100 according to the embodiment of the invention as depicted in FIG. 4c, including a multi-layer stack 102 and a spectral filter top layer 104 including only a first spectral purity enhancement layer 110 with layer thickness d1. FIG. 5 in facts shows a 3-layer system, wherein the first "layer" is the atmosphere above multi-layer mirror 100, for example a vacuum under processing conditions. The second layer is the first spectral purity enhancement layer 110; and the third layer of the system is the multi-layer stack 102. Radiation under normal incidence, for example between up to about 15°, is considered since the multi-layer stack 102 may also be used for normal incident light. Accordingly, the results are not polarization dependent, i.e. transverse electric mode (TE) is the same as transverse magnetic mode (TM).

The equation for the intensity reflection R for a multi-layer stack 102 with on top of the multi-layer stack 102 the first spectral purity enhancement layer 110 for light entering the system from layer 1 (ambient; atmosphere above multi-layer mirror 1) is:

$$R = |r|^2 \quad (1)$$
$$r = r_{12} + t_{21} \cdot b$$
$$b = \frac{r_{23} \cdot t_{12} \cdot \exp(i \cdot 2 \cdot K_2 \cdot t)}{1 - r_{23} \cdot r_{21} \cdot \exp(i \cdot 2 \cdot K_2 \cdot t)}$$
$$K_2 = \frac{2\pi}{\lambda} \cdot N_2$$

with:

$r_{pq}$ being the Fresnel amplitude reflection coefficient for the reflection of a normal incident plane wave entering from layer p and reflecting at the interface between p and q. Here $r_{23}$ is the reflection for light in the first spectral purity enhancement layer 110 at the interface between the first spectral purity enhancement layer 110 and the multi-layer stack 102;

$t_{pq}$ being the Fresnel amplitude transmission coefficient for transmission of a plane wave from layer p into layer q;

$\lambda$ wavelength of the light;

t thickness of first spectral purity enhancement layer 110 (i.e. d1);

$K_2$ wave number in medium p;

$N_p = n_p + j \cdot k_p$, the complex index of refraction of medium p.

For one skilled in the art, the Fresnel reflection are well known and can be found in virtually any book on optics (see, for example, E. Hecht, "Optics," 2nd edition, Addison Wesley, 1997, which is incorporated herein by reference). For normal incident light, the Fresnel reflection for light coming from medium p at the interface between medium p and medium q is independent of the polarization and given by: $r_{pq} = (N_p - N_q)/(N_p + N_q)$. In case of a multi-layer, one should calculate the reflection $r_{23}$ for a beam coming from layer 2 at the interface between the first spectral purity enhancement layer 110 and the multi-layer stack 102.

The thickness of the first spectral purity enhancement layer 110 may be as small as possible in order to avoid EUV losses. In a further embodiment the first spectral purity enhancement layer 110 includes a material m1 selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF. In a further embodiment, material m1 is selected from SiN, $Si_3N_4$, $SiO_2$, ZnS, Te, diamond, CsI, Se, SiC or amorphous carbon. The spectral filter top layer 104, in this embodiment first spectral purity enhancement layer 110, has a layer thickness d1 between about 0.5 and 30 nm. Embodiments according to the present invention are given in Table 1 below:

TABLE 1 examples of embodiments of a single layer spectral purity enhancement layer 104

| Material of spectral purity enhancement layer 104 (i.e. of first spectral purity enhancement layer 110) | Wavelength range (nm) | Thickness of d1 (nm) | Further embodiment of thickness of d1 (nm) |
|---|---|---|---|
| a-C | 100-150 | 1-10 | 3-7 |
| SiC | 200-300 | 3-17 | 5-15 |
| SiC | 300-400 | 17-30 | 19-28 |
| $Si_3N_4$ | 130-200 | 5-10 | 6-9 |
| $Si_3N_4$ | 200-250 | 10-15 | 11-14 |

TABLE 1-continued examples of embodiments of a single layer spectral purity enhancement layer 104

| Material of spectral purity enhancement layer 104 (i.e. of first spectral purity enhancement layer 110) | Wavelength range (nm) | Thickness of d1 (nm) | Further embodiment of thickness of d1 (nm) |
|---|---|---|---|
| d-C | 130-180 | 3-5 | 3.5-4.5 |
| d-C | 100-200 | 0.5-10 | 2-8 |
| d-C | 200-300 | 7-20 | 9-19 |
| $SiO_2$ | 100-140 | 3-5 | 3.5-4.5 |

A reflection that is as low as possible requires, when projecting a ray r of beam PB on multi-layer mirror 1, destructive interference between the undesired radiation that is directly reflected and undesired radiation that has propagated at least one roundtrip in the first spectral purity enhancement layer 110.

In order to derive an equation for the thickness of the first spectral purity enhancement layer 110 the complex amplitudes of the direct reflection ($r_{12}$) and the contribution to the reflection that has propagated one roundtrip in the first spectral purity enhancement layer 110 ($r_1$) are compared:

$$r_1 = t_{12} \cdot t_{21} \cdot r_{23} \cdot \exp(i \cdot 2 \cdot K_2 \cdot t) \quad (2)$$

For destructive interference between the direct reflection and the contribution that has propagated one roundtrip in the first spectral purity enhancement layer 110, the argument of the ratio $Q = r_1/r_{12}$ should be $\pi$:

$$r_1 = t_{12} \cdot t_{21} \cdot r_{23} \cdot \exp(i \cdot 2 \cdot K_2 \cdot t) \quad (3)$$
$$Q = \frac{t_{12} \cdot t_{21} \cdot r_{23} \cdot \exp(i \cdot 2 \cdot K_2 \cdot t)}{r_{12}}$$

destructive interference: $\arg(Q) = \pi$

According to $N = n + j \cdot k$, wherein N=complex index of refraction, n=real part of the complex index of refraction and k=imaginary part of the complex index of refraction, for example for a system as described above and as depicted in FIG. 5, with as top layer 103 of the multi-layer stack 102 a-Si (instead of a Si/Mo multi-layer stack) and a $Si_3N_4$ as first spectral purity enhancement layer 110, the refractive indexes for a wavelength of 198.4 nm are:

| Air | $N1 = 1$ |
| $Si_3N_4$ | $N2 = 2.62 + j * 0.174$ |
| a-Si | $N3 = 1.028 + j * 2.1716981$ |

Figure 6:
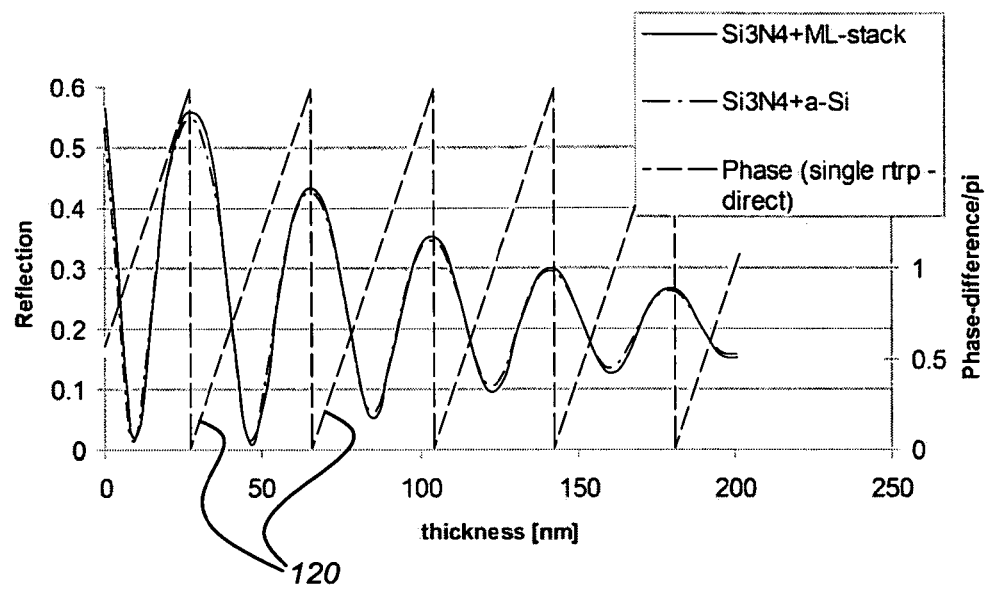
FIG. 6 depicts the influence of the layer thickness of a spectral purity enhancement layer according to an embodiment of the present invention on the reflectivity.

Calculating the impact of a $Si_3N_4$ on i) an a-Si/Mo multi-layer stack 102 using IMD software and ii) an a-Si substrate (as model, instead of a multi-layer stack 102) using equation (1) results as depicted in FIG. 6 are obtained. In this figure the results of the model with a-Si/Mo multi-layer stack 102 using IMD software and the results of a-Si substrate (as model, instead of a multi-layer stack 102) using equation (1) are depicted and there appears to be a remarkable overlap between the calculation for $Si_3N_4$ on a multi-layer stack and $Si_3N_4$ on a a-Si substrate. This indicates a high reflection at the $Si_3N_4$/a-Si interface. When calculating the phase difference between the direct reflection and the contribution that has propagated a single roundtrip in the spectral purity enhancement layer 104, here first spectral purity enhancement layer 110 ($Si_3N_4$) coating using equation (3) (providing the repeatedly slashed curve in FIG. 6 (note the vertical axes at the right), also indicated with reference number 120), it can be seen that there is only a small difference between the thickness (X-axis) of the $Si_3N_4$ layer where the phase difference between the direct reflection and the contribution that has propagated once through the first spectral purity enhancement layer 110 is $\pi$ and the minimum values for the reflection of the air/$Si_3N_4$/a-Si three-layer model. So criterion (3) indeed seems to be a good criterion for the thickness. Where the phase difference is $\pi$, both i) and ii) have their minimum destructive interference, and where the phase difference is $2\pi$ both i) and ii) have their maximum destructive interference. Since the layer thickness d (here d1) is as small as possible, the first minimum where the phase difference is $\pi$ will be chosen, resulting in a layer thickness d1 for this embodiment of about 4-11 nm, for example about 9±1 nm, for this wavelength (198.4 nm) to be diminished. Considering the amplitude reflections and transmissions at the interfaces:

TABLE 2 reflections and transmissions at interfaces in model of FIG. 4c and 5 for 198.4 nm radiation

| Interface | Reflection | Transmission |
| --- | --- | --- |
| Air/$Si_3N_4$ | Magnitude: 0.45 | Magnitude: 0.552 |
| | Phase: 0.019 * $\pi$ | Phase: −0.015 * $\pi$ |
| $Si_3N_4$/(a-Si) | Magnitude: 0.589 | Magnitude: 1.211 |
| | Phase: 0.532 * $\pi$ | Phase: −0.161 * $\pi$ |
| $Si_3N_4$/Air | Magnitude: 0.45 | Magnitude: 1.449 |
| | Phase: −0.981 * $\pi$ | Phase: 0.006 * $\pi$ |

The reflections and transmissions relevant for the phase difference between the direct reflection and the contribution that has propagated once through first spectral purity enhancement layer 110 are in italics. Table 2 shows a large phase shift due to the reflection at the $Si_3N_4$/a-Si interface of 0.532*$\pi$. The other phase shifts at the interface are relatively small and the total phase difference between the direct reflection and the contribution that has propagated once through first spectral purity enhancement layer 110 is 0.52*$\pi$. Due to the high real index of the $Si_3N_4$ layer a thickness of only about 4-11 nm, for example about 9 nm, is sufficient for an additional phase shift of 0.48*$\pi$ and a total phase difference of $\pi$ assuming undesired radiation having a wavelength of 198.4 nm.

Therefore, the present invention further provides an embodiment including a multi-layer mirror 1, wherein the material m1 of the layer 110 and the layer thickness d1 of the layer 110 included in the spectral filter top layer 104 are designed such as to fulfill the following criteria:

$$r_1 = t_{12} \cdot t_{21} \cdot r_{23} \cdot \exp(i \cdot 2 \cdot K_2 \cdot t) \quad (3)$$

$$Q = \frac{t_{12} \cdot t_{21} \cdot r_{23} \cdot \exp(i \cdot 2 \cdot K_2 \cdot t)}{r_{12}}$$

destructive interference: $\arg(Q) = \pi$ wherein:

$r_{12}$ is the Fresnel amplitude reflection coefficient for the reflection of a normal incident plane wave entering from a layer 1 (i.e. atmosphere above multi-layer mirror 1) and reflecting at the interface between layer 1 and layer 2 (i.e. first spectral purity enhancement layer 110), wherein layer 1 and layer 2 are the atmosphere above the multi-layer mirror and the spectral filter top layer 104 (i.e. first spectral purity enhancement layer 110), respectively;

$r_{23}$ is the Fresnel amplitude reflection coefficient for the reflection of a normal incident plane wave entering from a layer 2 and reflecting at the interface between layer 2 and layer 3, wherein layer 2 and layer 3 are the spectral filter top layer 104 (i.e. first spectral purity enhancement layer 110) and the multi-layer stack top layer 103, respectively;

$t_{pq}$ is the Fresnel amplitude transmission coefficient for transmission of a plane wave from layer p into layer q;

$\lambda$ is the wavelength of the radiation; and t is the thickness of the spectral filter top layer 104 (i.e. first spectral purity enhancement layer 110; hence, in these embodiments t=d=d1).

Hence, the initial value for thickness should be chosen such that relation (3) is obeyed. If necessary, further experimentation can be performed by minimizing the reflection for the system with the multi-layer stack. For a as small as possible thickness d1 of the first spectral purity enhancement layer 110 (in this embodiment d=d1), the refractive index of the first spectral purity enhancement layer 110 is in an embodiment chosen such that magnitude of the reflection at the interface between first spectral purity enhancement layer 110 and the multi-layer stack top layer 103 of multi-layer stack 102 is large and also the phase shift due to the reflection at this interface is large. In an embodiment, layer 110 is be chosen such that the magnitude of Q (as defined in equation (3)) is as close as possible to 1, in a further embodiment within the range of 1±0.05, and $\arg(Q)=(1\pm0.05)*\pi+s*2\pi)$(wherein s is a integer$\geq$0). For multiple reflections, this may not be exactly true anymore, but it is still a good choice. In an embodiment, this can be achieved by choosing a material m1 for the first spectral purity enhancement layer 110 whose real part (n) is as large as possible and the imaginary part (k) of the indexes of refraction as small as possible, or an as large as possible roundtrip phase shift ($\arg(Q)=\pi, 3*\pi, 5*\pi$, etc.) due to propagation through the first spectral purity enhancement layer 110 for given thickness d1 of the first spectral purity enhancement layer 110, which requires a large real part of the refractive index for the material of this layer.

Hence, according to an embodiment of the present invention there is provided a multi-layer mirror 100, wherein the first spectral purity enhancement layer 110 has an imaginary part of the complex index of refraction $k \leq 0.25*n+1.07$, wherein n is the real part of the complex index of refraction. According to yet another embodiment of the present invention, the real part of the complex index of refraction is equal or larger than 1.5 and the imaginary part of the complex index of refraction is equal or smaller than 2. In yet a further embodiment, the first spectral purity enhancement layer 110 has a real part of the complex index of refraction equal or larger than 2 and a imaginary part of the complex index of refraction is equal or smaller than 1.6. The indices of refraction here refer to indices of refraction at a radiation wavelength or within a radiation wavelength range selected from the range of 100-400 nm, for example between 100 and 200 nm. For example, when it is desired to diminish radiation at a wavelength of 190 nm, or within a wavelength range of 130-190 nm, materials and layer thicknesses are selected fulfilling the criteria as described herein.

According to another embodiment of the present invention, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including: a first spectral purity enhancement layer 110 including a material m1 and having a layer thickness d1, being arranged on the multi-layer stack top layer 103, wherein the first spectral purity enhancement layer 110 includes a material m1 having an imaginary part of the complex index of refraction $k \leq 0.25*n+1.07$, wherein n is the real part of the complex index of refraction and the spectral filter top layer 110 has a layer thickness d1 between 0.5 and 30 nm.

According to yet another embodiment, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1, being arranged on the multi-layer stack top layer 103, wherein the first spectral purity enhancement layer 110 includes a material m1 having a real part of the complex index of refraction equal to or larger than 2 and a imaginary part of the complex index of refraction equal to or smaller than 1.6, and the spectral filter top layer 110 has a layer thickness d1 between 0.5 and 30 nm.

These embodiments may be combined.

According to yet another embodiment of the invention, there is provided a multi-layer mirror 100, wherein the material of the layer and the layer thickness d of the layer included in the spectral filter top layer 104 (i.e. the material m1 and layer thickness d1 of first spectral purity enhancement layer 110) are designed such as to: minimize absorption and/or destructive interference of radiation having a wavelength selected from a first wavelength range of 5-20 nm, and maximize absorption and/or destructive interference of radiation having a wavelength selected from a second wavelength range of 100-400 nm.

According to another embodiment, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1, being arranged on the multi-layer stack top layer 103, wherein the first spectral purity enhancement layer 110 includes a material m1 selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF and the spectral filter top layer 110 has a layer thickness d1 between 0.5 and 30 nm.

Figure 7:
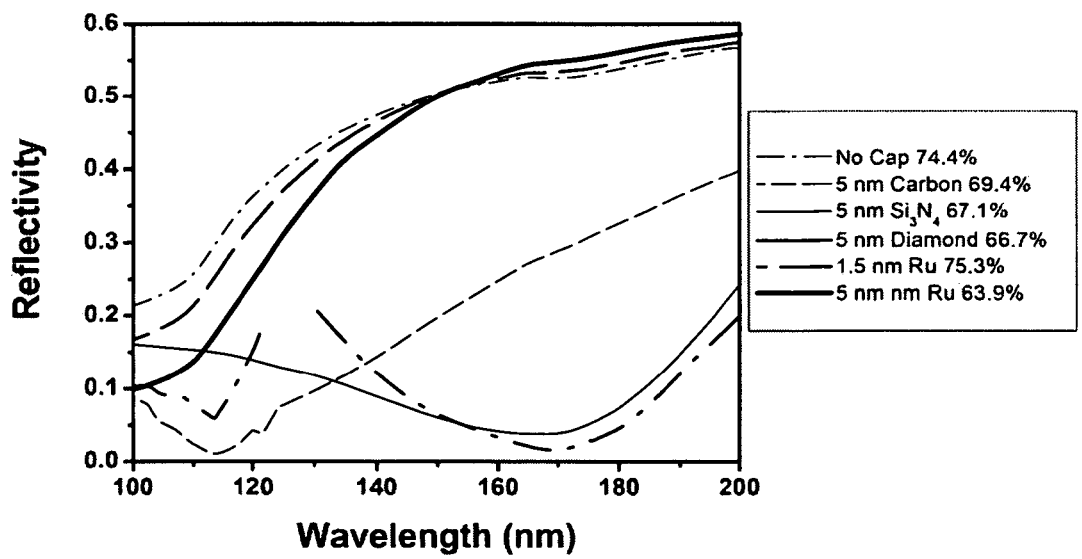
FIG. 7 depicts the influence on the reflectivity for a selection of a number of materials for the spectral purity enhancement layer according to an embodiment of the present invention.
Figure 8:
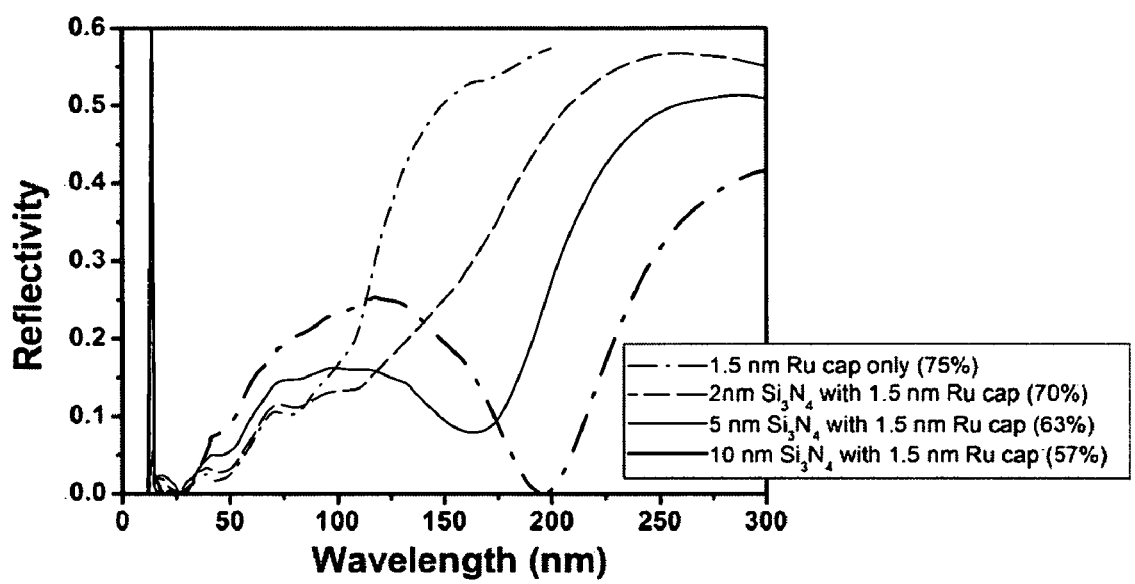
FIG. 8 depicts the influence of the layer thickness on the reflectivity when using a spectral purity enhancement layer of $Si_3N_4$ according to an embodiment of the present invention.

Further variations on this embodiment are shown in FIGS. 7 and 8, which depict the influence of the selection of a number of materials m1 for the spectral purity enhancement layer 104 (i.e. 110) on the reflectivity, and the influence of the thickness d (i.e. d1) of a spectral purity enhancement layer 110 of $Si_3N_4$ on the reflectivity, respectively. These embodiments are all directed to a standard 50 layer Si/Mo multi-player mirrors 100, with a top layer 103 of a certain material (e.g. Si). The percentages listed in the legend give the reflectivity for 13.5 nm EUV radiation; the values on the y-axis indicate the reflectivity (*100%). FIG. 7 shows some theoretical examples of first spectral purity enhancement layers 110 on a multi-layer mirror 1 for the 100-200 nm range. Embodiments of good candidate materials m1 for first spectral purity enhancement layers 110 are amorphous carbon, diamond, SiC and $Si_3N_4$. Simulations indicate that a combination of high index of refraction in the target wavelength and a low absorption for EUV are desirable (see also above). The resulting reflectivity curves are a combination of the reflectivity curve for the multi-layer mirror 100 (i.e. the multi-layer stack 102) and the spectral purity enhancement layer 104 (i.e. in these embodiments first spectral purity enhancement layer 110). In addition to that, the reflectivity curve of the first spectral purity enhancement layer 110 also changes depending on the thickness (see also above; and FIG. 6). Due to this, the wavelength with minimum reflectivity depends on the thickness of first spectral purity enhancement layer 110. FIG. 8 shows another embodiment using $Si_3N_4$ as first spectral purity enhancement layer 110 and a Si/Mo multi-layer stack 102 with varying thickness d1. Hence, in a embodiment, there is provided a multi-layer mirror 100 with a spectral purity enhancement layer 104 including only a the first spectral purity enhancement layer 110 which includes $Si_3N_4$, the first spectral purity enhancement layer 110 having a layer thickness d1 between 4 and 11 nm.

For providing the spectral purity enhancement layer 104, e.g. a spectral purity enhancement layer 1-4 only including a first spectral purity enhancement layer 110, LP-CVD, PE-CVD or other techniques may be used. A model study was made by depositing a $Si_3N_4$ layer on a silicon wafer in order to test the principle of SPE-layers in practice. A layer thickness d1 of 15 nm is chosen. For this thickness, the lowest theoretical reflectivity is about 10%, so the first spectral purity enhancement layer 110 does not work very well in this range, but the reflectivity loss is sufficient to be able to show proof-of-principle. Using ellipsometry, the thickness d1 of the deposited $Si_3N_4$ layer 110 was determined to be 13.5 nm (LP-CVD deposition time was 1 minute and 45 seconds), with an estimated RMS surface roughness of around 0.5 nm.

Figure 9:
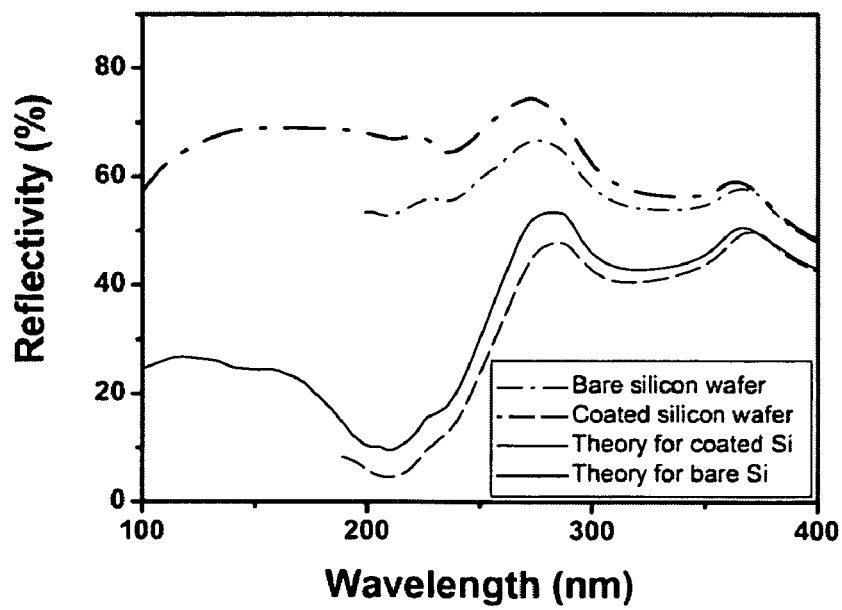
FIG. 9 depicts a model study on the reflectivity for a spectral purity enhancement layer according to an embodiment of the present invention.

FIG. 9 shows the measured reflectivity curve for the $Si_3N_4$ coated silicon-wafer, compared with the measured reflectivity curve for a bare silicon wafer. The theoretical curves from IMD are also shown. It is evident that the experimental first spectral purity enhancement layer 110 has a very good agreement with the calculated values, which demonstrates that the principle of the spectral purity enhancement layer 104 (in this embodiment only first spectral purity enhancement layer 110) works as expected.

As shown in FIG. 8, on top of the spectral purity enhancement layer 104, a cap layer 105 may be present. Hence, according to yet another embodiment of the present invention, there is provided a multi-layer mirror 100, wherein the spectral filter top layer 104 further includes a cap layer 105 on top of the first spectral purity enhancement layer 110, including Ru and having a layer thickness d4 between 0.5 and 2.5 nm. Alternatively, in an embodiment also other materials may be used as cap layer 105, for example a material m4 selected from BN, $B_4C$, B, C (e.g. diamond-like carbon), TiN, Pd, Rh, Au, or $C_2F_4$. In yet another alternative embodiment, the first spectral purity enhancement layer 110 is further used as cap layer 105. Suitable materials m4 as for use as cap layer 105 (i.e. first spectral purity enhancement layer 110 is at the same time cap layer 105) may be selected from SiN, $Si_3N_4$, SiC, $MgF_2$ or LiF. The cap layer may provide a further protection against oxidation of chemical of physical attack by particles from the source or other particles or gasses present in, for example, a lithographic apparatus wherein the multi-layer mirror 100 according to the present invention is used. Hence, in another embodiment there is provided a multi-layer mirror, wherein the spectral filter top layer 104 further includes a cap layer 105 on top of the first spectral purity enhancement layer 110, the cap layer 105 including a material m4 selected from Ru, BN, $B_4C$, B, C (e.g. diamond-like carbon), TiN, Pd, Rh, Au, $C_2F_4$, SiN, $Si_3N_4$, SiC, $MgF_2$ or LiF, and having a layer thickness d4 between 0.5 and 11 nm. In a variation, materials m1 of first spectral purity enhancement layer 110 includes a material different from material m4 of cap layer 105, for example m1 is $Si_3N_4$ and m4 is Ru.

Figure 10:
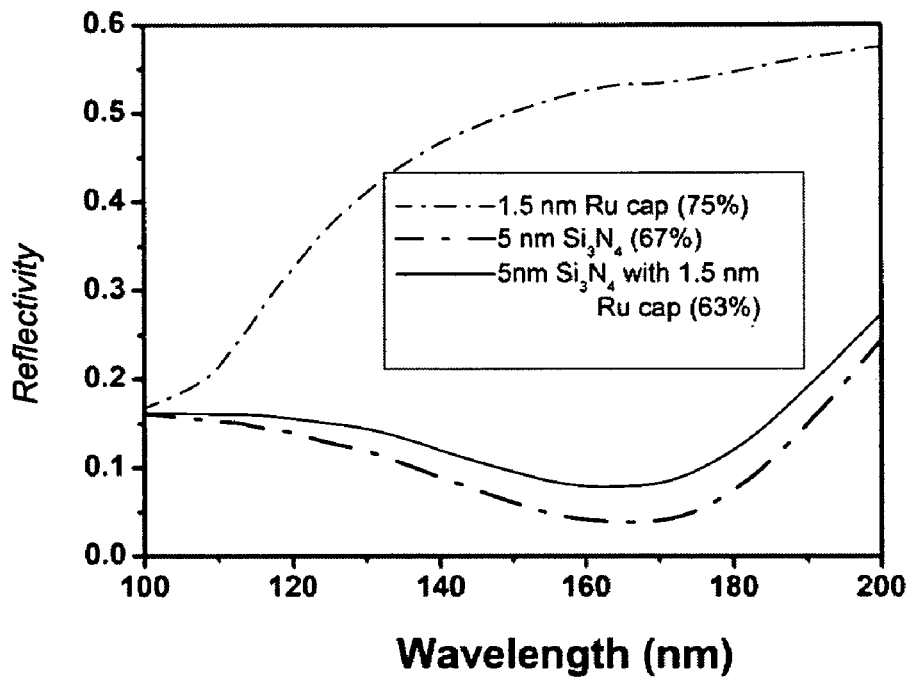
FIG. 10 depicts the influence on the reflectivity of a cap layer on a spectral purity enhancement layer according to an embodiment of the present invention.

An example reflection (y-axis*100%) of an embodiment with a cap layer 105 as a function of the wavelength of the radiation is shown in FIG. 10, which depicts the influence of a cap layer 105 including Ru on a spectral purity enhancement layer 110 on the reflectivity.

In an embodiment, it is assumed that the normal suppression of light by a conventional multi-layer mirror 100 is not sufficient in the DUV range between 130 and 190 nm and that the current DUV intensity needs to be reduced to 10% of its current power. These are typical values that one might expect for an EUV lithography tool. The EUV lithography system contains typically 11 Si/Mo multi-layer mirrors. The first spectral purity enhancement layer 110 according to above described embodiments will be placed on some of these mirrors 100, e.g. on multi-layer stack top layer 103, in order to achieve enough suppression in the DUV range. Using a first spectral purity enhancement layer 110 provides flexibility in choosing the suppression and resulting losses for EUV light. With a normal spectral purity filter, the losses are always about 50%, but in this case they can be much lower. Because the DUV range between 130 and 190 nm needs to be suppressed, in an embodiment a 5 nm $Si_3N_4$ first spectral purity enhancement layer 110 is chosen.

Figure 11:
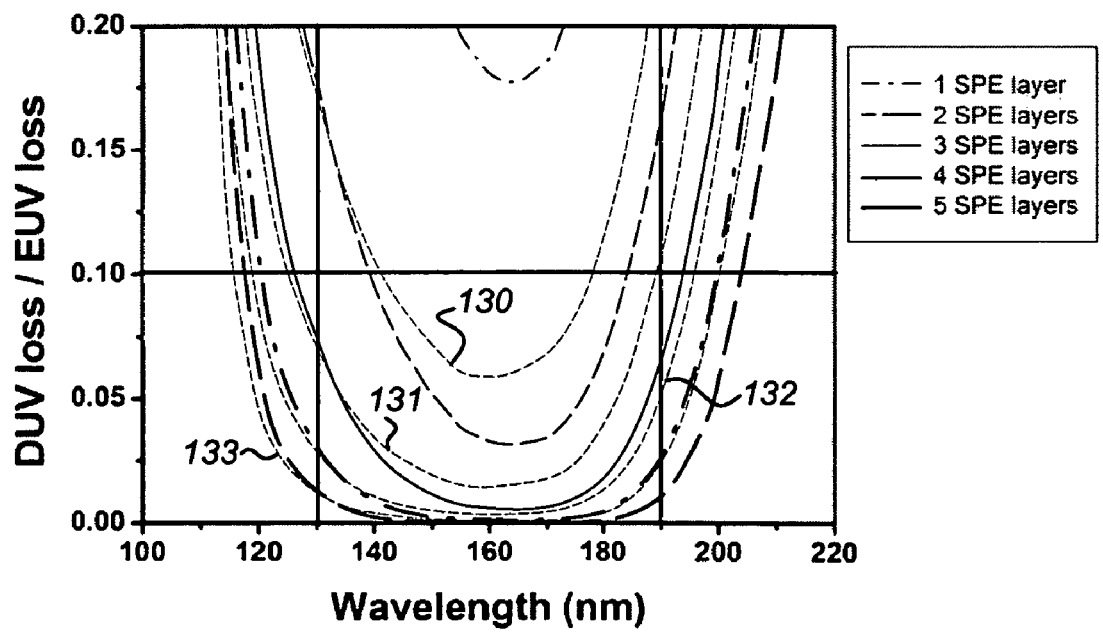
FIG. 11 depicts the influence of a number of spectral purity enhancement layers according to an embodiment of the present invention on the ratio of DUV and EUV loss.

FIG. 11 shows the suppression of DUV light for an increasing number (1-5) of first spectral purity enhancement layers 110, i.e. an increasing number of multi-layer mirrors 100 including such first spectral purity enhancement layer 110, and also shows the target of 10% reflectivity in the DUV range (horizontal dashed line). From FIG. 11 it can be seen that two multi-layer mirrors with Ru-capped 5 nm $Si_3N_4$ first spectral purity enhancement layer 110 are enough to reach the desired DUV suppression. In fact, with two first spectral purity enhancement layers 110 the DUV is reduced to below 15% for any wavelength in the range of 130-190 nm and the average reduction is down to 7%. The EUV losses caused by this can be calculated by comparing the reflectivity of two normal Ru-capped multi-layer mirrors 100 (R~75% per mirror, total $R_{tot}$~56%) with two Ru-capped multi-layer mirrors 100 with 5 nm $Si_3N_4$ first spectral purity enhancement layers 110 (R~63% per mirror, $R_{tot}$~40%), resulting in a loss of 16% for EUV light due to the first spectral purity enhancement layers 110. For comparison, a normal spectral purity filter has 50% losses. When comparing the EUV losses given here with absorption through a 2×5=10 nm $Si_3N_4$ layer, the losses are 6% per multi-layer mirror 1, which means that the multi-layer mirror 1 reflectivity should be 69% instead of the calculated 63%. This extra EUV loss is due to interference effects occurring for the EUV wavelength. In order to circumvent this, the $Si_3N_4$ layer can be split into two parts, with a layer of for instance Mo in-between. When doing this, the calculated EUV reflectivity for the mirror is 68%, completely in agreement with EUV absorption in the first spectral purity enhancement layer 110. This will be elucidated below in another aspect of the present invention.

It is possible to calculate the number of first spectral purity enhancement layers 110 that have the same losses as a normal spectral purity filter (NOSPE) (50%):

$$\left(\frac{R_{EUV,SPE}}{R_{EUV,NOSPE}}\right)^X = 0.5 \Rightarrow X = \frac{\log(0.5)}{\log\left(\frac{R_{EUV,SPE}}{R_{EUV,NOSPE}}\right)} = \frac{\log(0.5)}{\log(0.84)} = 4$$

This means that with four normal first spectral purity enhancement layers 110, the total losses for EUV are 50%, with an average DUV reduction down to 0.7% (roughly two orders of magnitude). If no Ru cap layer 105 is used on top of the normal first spectral purity enhancement layer 110, for example because the first spectral purity enhancement layer 110 can act as a cap layer itself, then a total of 6 first spectral purity enhancement layers 110 can be used for the same losses of 50%, giving an average DUV suppression down to 0.012% (roughly four orders of magnitude).

In an embodiment, the multi-layer mirror 100 according to the present invention is a normal incidence mirror configured to reflect radiation having a wavelength selected from a first wavelength range of 5-20 nm. In yet a further embodiment, the multi-layer mirror 100 according to the present invention is a normal incidence Si/Mo multi-layer mirror configured to reflect radiation having a wavelength selected from the wavelength range of 12-15 nm, for example 13.5 nm EUV radiation.

According to yet another aspect of the present invention, there is provided a lithographic apparatus, for example as described above, including one or more multi-layer mirrors 100 as described above and as schematically depicted in FIGS. 4c and 5. Hence, in another aspect, the present invention also provides a method for enlarging the ratio of radiation having a wavelength selected from a first wavelength range of 5-20 nm and radiation having a wavelength selected from a second wavelength range of 100-400 nm in a beam of radiation of a source emitting radiation in both wavelength ranges, by reflecting at least part of the beam of radiation of the source on a mirror.

As mentioned above, in a further embodiment, the lithographic apparatus includes two or more multi-layer mirrors 100 according to the present invention, which are placed as normal incidence mirrors in the beam of radiation produced by the source SO. Hence, in an embodiment, a lithographic apparatus and/or a method are provided wherein a plurality of multi-layer mirrors 100 according to the present invention are used, e.g. in a further embodiment two or more, and wherein reflected radiation of a multi-layer mirror closest to a source in the beam of radiation generated by the source, is reflected on one or more next multi-layer mirrors 100, respectively.

According to yet a further embodiment, there is provided a lithographic apparatus and/or a method, wherein the lithographic apparatus includes a plurality of multi-layer mirrors 100 as described above and wherein the materials m1 of the layers 104 (i.e. first spectral purity enhancement layer 110) and the layer thicknesses d (i.e. d1) of the layers 110 included in the spectral filter top layers 104 of the different multi-layer mirrors 100, respectively, are designed such as to: minimize absorption and/or destructive interference of radiation having a wavelength selected from a first wavelength range of 5-20 nm; and maximize absorption and/or destructive interference of radiation having a wavelength selected from a substantial part of the wavelength range of 100-400 nm.

By using a number of multi-layer mirrors 100 according to the present invention, wherein the multi-layer mirrors vary in thickness d1 or material m1 or both for the first spectral purity enhancement layers 110, respectively, the filtering away of undesired wavelengths can be tuned such that desired wavelength, for example between 5 and 20 nm is not reduced substantially (e.g. less than about 50% reduction with respect to the same multi-layer mirrors without such first spectral purity enhancement layers 110), whereas DUV radiation is reduced substantially (e.g. a reduction with 90%, or about 95%, or even about 99% or more, with respect to the same multi-layer mirrors without such first spectral purity enhancement layers 110). Such a reduction may apply in an embodiment to a substantial part of the wavelength range of 100-400 nm, for example for 15% of the wavelength range between 100 and 400 mm, i.e. for at least about 15% of the wavelength range, the radiation reduction is at least about 90% of the total radiation at this about 15% part of the wavelength range. In an embodiment, at least the radiation at wavelengths between about 130 and 190 nm is reduced with about 90%, or more.

In an embodiment, one or more multi-layer mirrors 100 may be supplied with a spectral purity enhancement layer 104 designed for reduction of radiation having a wavelength in the range of 100-200 nm and one or more multi-layer mirrors 100 may be supplied with a spectral purity enhancement layer 104 designed for reduction of radiation having a wavelength in the range of 200-300 nm.

According to yet another aspect of the present invention, there is provided a device manufacturing method including providing a beam of radiation; patterning the beam of radiation; projecting the patterned beam of radiation onto a target portion of a substrate; enlarging the ratio of radiation having a wavelength selected from a first wavelength range of 5-20 nm and radiation having a wavelength selected from a second wavelength range of 100-400 nm in a beam of radiation of a source emitting radiation in both wavelength ranges by reflecting at least part of the beam of radiation of the source on a mirror according to the embodiments as described above.

As mentioned above, a number of multi-layer mirrors 100 with first spectral purity enhancement layers 110 may be used. Alternatively, according to yet another aspect of the present invention and as schematically depicted in FIG. 4a, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 103, the spectral filter top layer 104 including a first spectral purity enhancement layer 110 including a material m1 and having a layer thickness d1; an intermediate layer 111 including a material m2 and having a layer thickness d2; a second spectral purity enhancement layer 112 including a material m3 and having a layer thickness d3, the second spectral purity enhancement layer 112 being arranged on the multi-layer stack top layer 103.

As mentioned above in the above embodiments with a single spectral purity enhancement layer 110, there may be some extra EUV loss due to interference effects occurring for the EUV wavelength. A thickness of the first spectral purity enhancement layer 110 may be determined for which the interference in the EUV does not give negative effects (see above embodiment with a spectral purity enhancement layer 104 including only a first spectral purity enhancement layer 110), for example a thickness for interference in the EUV regions does not occur (for example a 7 nm $Si_3N_4$ layer may not have losses due to EUV interference), or one chooses the extra layer 111 in-between, which is described in the present embodiment (spectral filter top layer 104 including a first 110 and second 112 spectral purity enhancement layer 110 and an intermediate layer 111).

Hence, in order to circumvent or minimize possible EUV interference losses, according to the present embodiment of the present invention, first spectral purity enhancement layer 110 (e.g. $Si_3N_4$) is "split" into two parts, i.e. a first spectral purity enhancement layer 110 and a second spectral purity enhancement layer 112, with a intermediate layer 111, for example Mo, in-between. This may lead to a reduction in interference loss. When doing this, the calculated EUV reflectivity for the mirror 100 can be 68%, assuming $Si_3N_4$, completely in agreement with EUV absorption in the first spectral purity enhancement layer 110.

Referring to FIG. 11, the dotted curves represent the following: 130: 2 mirrors with a split spectral purity enhancement layer; 131: 3 mirrors with a split spectral purity enhancement layer; 132: 4 mirrors with a split spectral purity enhancement layer; 133: 5 mirrors with a split spectral purity enhancement layer. Herein, split spectral purity enhancement layer refers to the embodiment as depicted in FIG. 4a: one first spectral purity enhancement layer 110, and intermediate layer 111 and a second spectral purity enhancement layer 112. FIG. 11 shows the same calculation as shown with the solid curves (i.e. one or more multi-layer mirrors 100, each having a spectral purity enhancement layer 104 including only a first spectral purity enhancement layer 110), but in this case with a first spectral purity enhancement layer 110 of 2.5 nm $Si_3N_4$, followed by an intermediate layer 111 of 2 nm Mo, followed by a second spectral purity enhancement layer 112 of 2.5 nm $Si_3N_4$, followed by a 2.5 nm Ru cap layer 105. The curves look very similar, but the dotted curve have slightly less DUV suppression and is slightly shifted to shorter wavelengths. In this case three multi-layer mirrors 100 with the spectral purity enhancement layer of this embodiment (split layer) may be needed in order to reach suppression below 10%, but the total losses are much lower, namely 11% EUV loss with an average DUV suppression down to 3.4% (three Ru-capped mirrors $R_{tot}$~42%; 3 Mo-split spectral purity enhancement layers 110 and 112 Ru-capped mirrors $R_{tot}$~31%).

As mentioned above, when using four normal first spectral purity enhancement layers 110, the total losses for EUV are 50%, with an average DUV reduction down to 0.7% (roughly two orders of magnitude). However, for the Mo-split first spectral purity enhancement layer of the present invention, a maximum of seven spectral purity enhancement layers 110+112 (i.e. seven spectral purity enhancement layers 104, each including layers 110, 111 and 112, and each being arranged on different multi-layer mirrors 100, respectively) can be used, with an average DUV suppression down to 0.06% (roughly three orders of magnitude). In a further embodiment, the thickness of d1+d2 is approximately the same as the thickness of d1 as given in the above described embodiment and as indicated in the embodiments of Table 1.

The present embodiment may use a Ru cap layer 105.

According to a further embodiment of the present invention, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1; an intermediate layer 111 including a material m2 and having a layer thickness d2; a second spectral purity enhancement layer 112 including a material m3 and having a layer thickness d3, the second spectral purity enhancement layer 112 being arranged on the multi-layer stack top layer 103, wherein the first 110 and second 112 spectral purity enhancement layers include independently a material (m1 and m3, respectively) selected from SiN, $Si_3N4$, $SiO_2$, ZnS, Te, diamond, CsI, Se, SiC, amorphous carbon, $MgF_2$, $CaF_2$, TiO2, Ge, $PbF_2$, $ZrO_2$, $BaTiO_3$, LiF or NaF and the intermediate layer 111 includes a material m3 different from the materials m1 and m2 from the first 110 and second 112 spectral purity enhancement layer, and the spectral filter top layer 104 has a layer thickness d=d1+d2+d3 between 2.5 and 40 nm.

In an embodiment, the multi-layer mirror 100 further optionally includes a cap layer 105 on top of the first spectral purity enhancement layer 104, including Ru and having a layer thickness d4 between 0.5 and 2.5 nm.

In yet another embodiment, the present invention provides a multi-layer mirror 100, wherein the intermediate layer includes a metal. In yet a further embodiment, there is provided a multi-layer mirror 100, wherein the intermediate layer includes a material m2 selected from Be, B, C, Si, P, S, K, Ca, Sc, Br, Rb, Sr, Y, Zr, Nb, Mo, Ba, La, Ce, Pr, Pa or U.

According to an embodiment of the present invention there is provided a multi-layer mirror 100 wherein the first spectral purity enhancement layer 110 and the second spectral purity enhancement layer 112 have an imaginary part of the complex index of refraction $k \leq 0.25*n+1.07$, wherein n is the real part of the complex index of refraction. According to yet another embodiment of the present invention, real part of the complex index of refraction is equal or larger than 1.5 and the imaginary part of the complex index of refraction is equal or smaller than 2. In yet a further embodiment, the first spectral purity enhancement layer 110 and the second spectral purity enhancement layer 112 have a real part of the complex index of refraction equal or larger than 2 and a imaginary part of the complex index of refraction is equal or smaller than 1.6. The indices of refraction here refer to indices of refraction at a radiation wavelength or within a radiation wavelength range selected from the range of 100-400 nm, and in a embodiment between 100 and 200 nm. For example, when diminishing radiation at a wavelength of 190 nm, or within a wavelength range of 130-190 nm, materials and layer thicknesses of the respective layers are selected fulfilling the criteria as described herein.

Hence, according to an alternative embodiment of the present invention, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1; an intermediate layer 111 including a material m2 and having a layer thickness d2; a second spectral purity enhancement layer 112 including a material m3 and having a layer thickness d3, the second spectral purity enhancement layer 112 being arranged on the multi-layer stack top layer 103, wherein the first 110 and second 112 spectral purity enhancement layers include independently a material (m1 and m3, respectively) having an imaginary part of the complex index of refraction $k \leq 0.25*n+1.07$, wherein n is the real part of the complex index of refraction, the intermediate layer 111 includes a material m3 different from the materials m1 and m2 from the first 110 and second 112 spectral purity enhancement layer, and the spectral filter top layer 104 has a layer thickness $d=d1+d2+d3$ between 2.5 and 40 nm.

Hence, according to yet another embodiment of the present invention, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1; an intermediate layer 111 including a material m2 and having a layer thickness d2; a second spectral purity enhancement layer 112 including a material m3 and having a layer thickness d3, the second spectral purity enhancement layer 112 being arranged on the multi-layer stack top layer 103, wherein the first 110 and second 112 spectral purity enhancement layers include independently a material (m1 and m3, respectively) having a real part of the complex index of refraction equal or larger than 2 and a imaginary part of the complex index of refraction is equal or smaller than 1.6, the intermediate layer 111 includes a material m3 different from the materials m1 and m2 from the first 110 and second 112 spectral purity enhancement layer, and the spectral filter top layer 104 has a layer thickness $d=d1+d2+d3$ between 2.5 and 40 nm.

Above mentioned embodiments may be combined.

In a further embodiment, there is provided a multi-layer mirror 100, wherein the materials (m1, m2 and m3, respectively) of the layers and the layer thicknesses (d1, d2 and d3, respectively) of the layers included in the spectral filter top layer are designed such as to minimize absorption and/or destructive interference of radiation having a wavelength selected from a first wavelength range of 5-20 nm, and maximize absorption and/or destructive interference of radiation having a wavelength selected from a second wavelength range of 100-400 nm.

In an embodiment, there is provided a multi-layer mirror 100, wherein the first 110 and second 112 spectral purity enhancement layers include $Si_3N_4$, each layer independently having a layer thickness d1 and d3, respectively, between 1.5 and 3.5 nm, and wherein the intermediate layer 111 includes Mo, having a layer thickness d2 between 1 and 3 nm. Alternative embodiments may have the same dimensions but with m1 and m2 each independently selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF.

In an embodiment, the multi-layer mirror 100 according to the present invention is a normal incidence mirror configured to reflect radiation having a wavelength selected from a first wavelength range of 5-20 nm. In yet a further embodiment, the multi-layer mirror 100 according to the present invention is a normal incidence Si/Mo multi-layer mirror configured to reflect radiation having a wavelength selected from the wavelength range of 12-15 nm, for example 13.5 nm EUV radiation.

According to yet another aspect of the present invention, there is provided a lithographic apparatus, for example as described above, including one or more multi-layer mirrors 100 as described above and as schematically depicted in FIG. 4a. Hence, in another aspect, the present invention also provides a method for enlarging the ratio of radiation having a wavelength selected from a first wavelength range of 5-20 nm and radiation having a wavelength selected from a second wavelength range of 100-400 nm in a beam of radiation of a source emitting radiation in both wavelength ranges, by reflecting at least part of the beam of radiation of the source on a mirror according to this embodiment.

As mentioned above, in a further embodiment, the lithographic apparatus includes two or more multi-layer mirrors 100 according to the present invention, which are placed as normal incidence mirrors in the radiation produced by the source SO. Hence, in a embodiment, a lithographic apparatus and/or a method are provided wherein a plurality of multi-layer mirrors 100 according to the present invention are used, for example in a further embodiment two or more, and wherein reflected radiation of a multi-layer mirror closest to a source in the radiation generated by the source, is reflected on one or more next multi-layer mirrors 100, respectively.

According to yet further embodiment, there is provided a lithographic apparatus an/or a method, wherein the lithographic apparatus includes a plurality of multi-layer mirrors 100 as described above and wherein the materials m1, m2 and m3, respectively of the first spectral purity enhancement layer 110, intermediate layer 111 and second spectral purity enhancement layer 112, respectively, included in spectral purity enhancement layer 104 and the layer thicknesses d1, d2 and d3 of the layers 110, 111 and 112, respectively, included in the spectral filter top layers 104 of the different multi-layer mirrors 100, respectively, are designed to minimize absorption and/or destructive interference of radiation having a wavelength selected from a first wavelength range of 5-20 nm, and maximize absorption and/or destructive interference of radiation having a wavelength selected from a substantial part of the wavelength range of 100-400 nm.

By using a number of multi-layer mirrors 100 according to the present invention, wherein the multi-layer mirrors vary in thickness d1, d2 and or d3 or material m1, m2, or m3 or both layer thicknesses and materials for the first 110 and second 112 spectral purity enhancement layers and the intermediate layer 111, respectively, the filtering away of undesired wavelengths can be tuned such that desired radiation, for example with a wavelength between 5 and 20 nm, is not reduced substantially (e.g. less than about 50% reduction with respect to the same multi-layer mirrors without such first 110 and second 112 spectral purity enhancement layers, split by intermediate layer 111; i.e.: the same multi-layer mirrors without such spectral purity enhancement layer 104 as shown in FIG. 4a), whereas DUV radiation is reduced substantially (e.g. a reduction with 90%, or about 95%, or even about 99%, with respect to the same multi-layer mirrors without such spectral purity enhancement layer 104 as shown in FIG. 4a). Such a reduction preferably applies in an embodiment to a substantial part of the wavelength range of 100-400 nm, e.g. for 15% of the wavelength range between 100 and 400 nm. In an embodiment, at least the radiation at wavelengths between about 130 and 190 nm is reduced with about 90%, or more.

In an embodiment, one or more multi-layer mirrors 100 may be supplied with a spectral purity enhancement layer 104 designed for reduction of radiation having a wavelength in the range of 100-200 nm and one or more multi-layer mirrors 100 may be supplied with a spectral purity enhancement layer 104 designed for reduction of radiation having a wavelength in the range of 200-300 nm.

According to yet another aspect of the present invention, there is provided a device manufacturing method including providing a beam of radiation; patterning the beam of radiation; projecting the patterned beam of radiation onto a target portion of a substrate; enlarging the ratio of radiation having a wavelength selected from a first wavelength range of 5-20 nm and radiation having a wavelength selected from a second wavelength range of 100-400 nm in a beam of radiation of a source emitting radiation in both wavelength ranges by reflecting at least part of the beam of radiation of the source on a mirror according to the embodiments as described above.

Referring to the above described embodiments, there is another "intermediate" embodiment, wherein the spectral purity enhancement layer 104 includes only a first spectral purity enhancement layer 110 and an intermediate layer 111, wherein the latter is positioned on the multi-layer stack top layer 103. Hence, according to yet another aspect of the present invention and as schematically depicted in FIG. 4a, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 103, the spectral filter top layer 104 including a first spectral purity enhancement layer 110 including a material m1 and having a layer thickness d1; an intermediate layer 111 including a material m2 and having a layer thickness d2, the intermediate layer 111 being arranged on the multi-layer stack top layer 103.

The present embodiment may be combined with the optional cap layer 105, for example Ru having a layer thickness d4 between 0.5 and 2.5 nm. Hence, in an embodiment, the multi-layer mirror 100 further optionally includes a cap layer 105 on top of the first spectral purity enhancement layer 104, including Ru and having a layer thickness d4 between 0.5 and 2.5 nm.

According to a further embodiment of the present invention, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1; an intermediate layer 111 including a material m2 and having a layer thickness d2, the intermediate layer 111 being arranged on the multi-layer stack top layer 103, wherein the first spectral purity enhancement layer 110 includes a material m1 selected from SiN, $Si_3N_4$, $SiO_2$, ZnS, Te, diamond, CsI, Se, SiC, amorphous carbon, $MgF_2$, $CaF_2$, TiO2, Ge, $PbF_2$, $ZrO_2$, $BaTiO_3$, LiF or NaF, the intermediate layer 111 includes a material m2 different from material m1 of the first spectral purity enhancement layer 110, and the spectral filter top layer 104 has a layer thickness d=d1+d2 between 2.5 and 40 nm.

In yet another embodiment, the present invention provides a multi-layer mirror 100, wherein the intermediate layer 111 includes a metal. In yet a further embodiment, there is provided a multi-layer mirror 100, wherein the intermediate layer 111 includes a material m2 selected from Be, B, C, Si, P, S, K, Ca, Sc, Br, Rb, Sr, Y, Zr, Nb, Mo, Ba, La, Ce, Pr, Pa or U.

According to an embodiment of the present invention there is provided a multi-layer mirror 100 wherein the first spectral purity enhancement layer 110 has an imaginary part of the complex index of refraction $k \leq 0.25*n+1.07$, wherein n is the real part of the complex index of refraction. According to yet another embodiment of the present invention, real part of the complex index of refraction is equal or larger than 1.5 and the imaginary part of the complex index of refraction is equal or smaller than 2. In yet a further embodiment, the first spectral purity enhancement layer 110 has a real part of the complex index of refraction equal or larger than 2 and a imaginary part of the complex index of refraction is equal or smaller than 1.6. The indices of refraction here refer to indices of refraction at a radiation wavelength or within a radiation wavelength range selected from the range of 100-400 nm, and in a embodiment between 100 and 200 nm. For example, when diminishing radiation at a wavelength of 190 nm, or within a wavelength range of 130-190 nm, materials and layer thicknesses of the respective layers are selected fulfilling the criteria as described herein.

Hence, according to an alternative embodiment of the present invention, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1; an intermediate layer 111 including a material m2 and having a layer thickness d2, the intermediate layer 111 being arranged on the multi-layer stack top layer 103, wherein the first spectral purity enhancement layer 110 includes a material m1 having a complex index of refraction $k \leq 0.25*n+1.07$, n is the real part of the complex index of refraction, the intermediate layer 111 includes a material m2 different from material m1 of the first spectral purity enhancement layer 110, and the spectral filter top layer 104 has a layer thickness d=d1+d2 between 2.5 and 40 nm.

According to yet a further alternative embodiment of the present invention, there is provided a multi-layer mirror 100, including a) a multi-layer stack 102, the multi-layer stack 102 including a plurality of alternating layers with a multi-layer stack top layer 103, and b) a spectral filter top layer 104 arranged on the multi-layer stack 102, the spectral filter top layer 104 including a first spectral purity enhancement layer 110 including a material m1 and having a layer thickness d1; an intermediate layer 111 including a material m2 and having a layer thickness d2, the intermediate layer 111 being arranged on the multi-layer stack top layer 103, wherein the first spectral purity enhancement layer 110 includes a material m1 having a real part of the complex index of refraction equal or larger than 2 and a imaginary part of the complex index of refraction is equal or smaller than 1.6, wherein the intermediate layer 111 includes a material m2 different from material m1 of the first spectral purity enhancement layer 110 and the spectral filter top layer 104 has a layer thickness d=d1+d2 between 2.5 and 40 nm.

Above mentioned embodiments may be combined.

In a further embodiment, there is provided a multi-layer mirror 100, wherein the materials (m1 and m2, respectively) of the layers and the layer thicknesses (d1 and d2, respectively) of the layers included in the spectral filter top layer are designed to minimize absorption and/or destructive interference of radiation having a wavelength selected from a first wavelength range of 5-20 nm, and maximize absorption and/or destructive interference of radiation having a wavelength selected from a second wavelength range of 100-400 nm.

In an embodiment, there is provided a multi-layer mirror 100, wherein the first 110 spectral purity enhancement layer includes $Si_3N_4$, having a layer thickness d1 between 4 and 1 nm, and wherein the intermediate layer 111 includes Mo, having a layer thickness d2 between 1 and 3 nm.

In an embodiment, the multi-layer mirror 100 according to the present invention is a normal incidence mirror configured to reflect radiation having a wavelength selected from a first wavelength range of 5-20 nm. In yet a further embodiment, the multi-layer mirror 100 according to the present invention is a normal incidence Si/Mo multi-layer mirror configured to reflect radiation having a wavelength selected from the wavelength range of 12-15 nm, e.g. 13.5 nm EUV radiation.

According to yet another aspect of the present invention, there is provided a lithographic apparatus, for example as described above, including one or more multi-layer mirrors 100 as described above and as schematically depicted in FIG. 4b. Hence, in another aspect, the present invention also provides a method for enlarging the ratio of radiation having a wavelength selected from a first wavelength range of 5-20 nm and radiation having a wavelength selected from a second wavelength range of 100-400 nm in a beam of radiation of a source emitting radiation in both wavelength ranges, by reflecting at least part of the beam of radiation of the source on a mirror.

As mentioned above, in a further embodiment, the lithographic apparatus includes two or more multi-layer mirrors 100 according to the present invention, which are placed as normal incidence mirrors in the radiation produced by the source SO. Hence, a lithographic apparatus and/or a method are provided wherein a plurality of multi-layer mirrors 100 according to the present invention are used, for example in a further embodiment two or more, and wherein reflected radiation of a multi-layer mirror closest to a source in the radiation generated by the source is reflected on one or more next multi-layer mirrors 100, respectively.

According to yet a further embodiment, there is provided a lithographic apparatus and/or a method wherein the lithographic apparatus includes a plurality of multi-layer mirrors 100 as described above and wherein the materials m1 and m2, of the layers first spectral purity enhancement layer 110 and intermediate layer 111, respectively, included in spectral purity enhancement layer 104 and the layer thicknesses d1 and d2, of the layers 110 and 111, respectively, included in the spectral filter top layers 104 of the different multi-layer mirrors 100, respectively, are designed to minimize absorption and/or destructive interference of radiation having a wavelength selected from a first wavelength range of 5-20 nm, and maximize absorption and/or destructive interference of radiation having a wavelength selected from a substantial part of the wavelength range of 100-400 nm.

By using a number of multi-layer mirrors 100 according to the present invention, wherein the multi-layer mirrors vary in thickness d1 and d2 or material m1 and m2 or both layer thicknesses and materials for the first spectral purity enhancement layer 110 and the intermediate layer 111, respectively, the filtering away of undesired wavelengths can be tuned such that desired wavelength, for example between 5 and 20 nm is not reduced substantially (e.g. less than about 50% reduction with respect to the same multi-layer mirrors without such first spectral purity enhancement layers 110), whereas DUV radiation is reduced substantially (e.g. a reduction with 90%, or about 95%, or even about 99%, with respect to the same multi-layer mirrors without such spectral purity enhancement layer 104 as shown in FIG. 4a). Such a reduction may apply in an embodiment to a substantial part of the wavelength range of 100-400 nm, e.g. for about 15% of the wavelength range between 100 and 400 nm. In an embodiment, at least the radiation at wavelengths between about 130 and 190 nm is reduced with about 90%, or more.

In an embodiment, one or more multi-layer mirrors 100 may be supplied with a spectral purity enhancement layer 104 designed for reduction of radiation having a wavelength in the range of 100-200 nm and one or more multi-layer mirrors 100 may be supplied with a spectral purity enhancement layer 104 designed for reduction of radiation having a wavelength in the range of 200-300 nm.

According to yet another aspect of the present invention, there is provided a device manufacturing method including providing a beam of radiation using the illumination system; patterning the beam of radiation; projecting the patterned beam of radiation onto a target portion of the substrate; enlarging the ratio of radiation having a wavelength selected from a first wavelength range of 5-20 nm and radiation having a wavelength selected from a second wavelength range of 100-400 nm in radiation of a source emitting radiation in both wavelength ranges by reflecting at least part of the radiation of the source on a mirror according to the embodiments as described above.

According to yet another aspect of the present invention, there is provided a lithographic apparatus, a method for enlarging the ratio of desired (EUV) to undesired (DUV) radiation and/or a device manufacturing method, wherein two or more multi-layer mirrors 100 selected from the three embodiments as described above are used. In an embodiment, one or more multi-layer mirrors 100 may be supplied with a spectral purity enhancement layer 104 designed for reduction of radiation having a wavelength in the range of 100-200 nm and one or more multi-layer mirrors 100 may be supplied with a spectral purity enhancement layer 104 designed for reduction of radiation having a wavelength in the range of 200-300 nm.

In addition to the embodiments described above, a stack of first spectral purity enhancement layer 110, intermediate layer 111 and second spectral purity enhancement layer 112 may also be applied. For example, this may be a multi-layer mirror 100 including a multi-layer stack 102 with on top of the multi-layer stack top layer 103 one or more selected of the following layer stacks (wherein the first (most left) number represents the layer arranged on the multi-layer stack top layer 103, and wherein n symbolizes the number of repeating the layer combinations): $(110/111)_n$, $(111/110)_n$, $(110/111)_n/$ 110, and $(111/110)_n/110$. Additionally, a cap layer 105 may be provided on the final layer (the last (most right) number), e.g. schematically: $102/(110/111)_n/110/105$.

As mentioned above, multi-layer mirror 100 may include a multi-layer (mirror) stack 102, e.g. including a number of alternating Mo/Si, or W/Si or WRe/Si, or other type of multi-layer stack, wherein multi-layer stack top layer 103 may include, for example Mo, Si, W, or WRe, etc. On top of this multi-layer stack top layer 103, the spectral filter top layer 104 according to the present invention is arranged, which may further optionally be capped with a cap layer 105 including a material m4 selected from Ru, BN, $B_4C$, B, C (e.g. diamond-like carbon), TiN, Pd, Rh, Au, $C_2F_4$, SiN, $Si_3N_4$, SiC, $MgF_2$ or LiF, having a layer thickness between 0.5 and 11 nm. In an, material m4 of cap layer 105 is not the same material as material m1 of first spectral purity enhancement layer 110. In yet a further embodiment, material m4 is selected from Ru, BN, $B_4C$, B, C (e.g. diamond-like carbon), TiN, Pd, Rh, Au, $C_2F_4$, $Si_3N_4$, SiC, $MgF_2$ or LiF or alloys or multi layers of two or more of these materials. In a variant mentioned above, cap layer 105 includes Ru, having a layer thickness d4 between 0.5 and 2.5 nm.

However, in an alternative embodiment, this multi-layer stack top layer 103 does not represent one of the layers of the multi-layer stack 102, but represents a cap layer, including a material m5 selected from Ru, BN, $B_4C$, B, C (e.g. diamond-like carbon), TiN, Pd, Rh, Au, $C_2F_4$, SiN, $Si_3N_4$, SiC, $MgF_2$ or LiF, having a layer thickness d5 between 0.5 and 11 nm. For example referring to FIGS. 3, 4a-4c and 5, multi-layer mirror 100 includes a) a multi-layer mirror stack 102, the multi-layer stack 102 including a plurality of alternating layers with a multi-layer stack top layer 103, wherein multi-layer stack top layer 103 represents a cap layer (with layer thickness d5) and b) a spectral filter top layer 104 arranged on the multi-layer stack 102, wherein this spectral filter top layer 104 is a spectral filter top layer 104 according to one of the above described embodiments. In an embodiment, material m5 of cap layer/multi-layer stack top layer 103 is not the same material as material m1 of first spectral purity enhancement layer 110.

In a variant, there is provided a multi-layer mirror 100, including a) a multi-layer stack 102, the multi-layer stack 102 including a plurality of alternating layers with a multi-layer stack top layer 103, wherein multi-layer stack top layer 103 represents a cap layer, and b) a spectral filter top layer 104 arranged on the multi-layer stack 102, the spectral filter top layer 104 including a first spectral purity enhancement layer 110 including a material m1 and having a layer thickness d1, being arranged on the multi-layer stack top layer 103, wherein the first spectral purity enhancement layer 110 includes a material m1 selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF, the spectral filter top layer 110 has a layer thickness d1 between 0.5 and 30 nm, and the cap layer includes a material m5 selected from Ru, BN, $B_4C$, B, C (e.g. diamond-like carbon), TiN, Pd, Rh, Au, $C_2F_4$, SiN, $Si_3N_4$, SiC, $MgF_2$ or LiF, having a layer thickness between 0.5 and 1 nm.

In a variation, the multi-layer stack top layer 103 includes Ru and has a layer thickness d5 between 0.5 and 2.5 nm. Spectral filter top layer 110 includes in an embodiment a layer thickness d1 of 4-11 nm $Si_3N_4$ (m5), and in a variation 5-7 nm $Si_3N_4$ (m5).

In an embodiment, a second cap layer 105 may be present, arranged on spectral filter top layer 104 (as shown in FIGS. 3 and 4a).

A spectral purity enhancement layer 104 is suited to suppress light in a certain target wavelength range, such as the DUV range between 130 and 190 nm.

A typical suppression of more than 1 order of magnitude can be achieved in the DUV region from 130-190 nm, using two mirrors with spectral purity enhancement layers 104, including a cap layer 105 of e.g. Ru. Without the Ru cap layer 105, even better suppression can be achieved with lower losses.

EUV loss can be reduced by splitting the spectral purity enhancement layer 104 in two parts, as described above and schematically depicted in FIG. 4a.

The spectral purity enhancement layer 104 can also act as a cap-layer to protect the multi-layer mirror 100 against oxidation.

Different materials can be used for different wavelengths.

Different spectral purity enhancement layers 104 can be used on different mirrors in order to achieve a broader absorption range (with different materials), or a stronger suppression (with the same material as spectral purity enhancement layer).

The spectral purity enhancement layer 104 normally does not lead to extra reflectivity for wavelengths other than the target wavelength range.

The use of a spectral purity enhancement layer 104 has the advantage of high flexibility, because one can choose the number of spectral purity enhancement layers 104 (and therefore the losses) depending on the suppression that is required.

In an EUV lithography system that is designed without a spectral purity filter, the spectral purity enhancement layers 104 can be added at any time.

Although reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below. Further, it should be appreciated that above described embodiments may be combined.

Other materials than materials selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF, may be selected, for example when the first spectral purity enhancement layer 110 (and where applicable also the second spectral purity enhancement layer 112) has an imaginary part of the complex index of refraction $k \leq 0.25*n+1.07$, wherein n is the real part of the complex index of refraction, or when, according to yet another embodiment of the present invention, the real part of the complex index of refraction is equal or larger than 1.5 and the imaginary part of the complex index of refraction is equal or smaller than 2, for material m1 (and where applicable material m3). In yet a further embodiment, a material m1 (and where applicable m3) is selected that fulfills both these criteria. In yet a further embodiment, material m1 of first spectral purity enhancement layer 110 (and where applicable material m3 of second spectral purity enhancement layer 112) has a real part of the complex index of refraction equal or larger than 2 and a imaginary part of the complex index of refraction is equal or smaller than 1.6.

In the specification, silicon nitride is referred to as $Si_3N_4$. However, this should be interpreted as including all Si—N compounds, such as SiN.

The present invention is not limited to application of the lithographic apparatus or use in the lithographic apparatus as described in the embodiments. Further, the drawings usually only include the elements and features that are necessary to understand the present invention. Beyond that, the drawings of the lithographic apparatus are schematic and not to scale. The present invention is not limited to those elements, shown in the schematic drawings (e.g. the number of mirrors drawn in the schematic drawings). Further, the present invention is not confined to the lithographic apparatus described in FIGS. 1 and 2.

What is claimed is:

1. A multi-layer mirror, comprising:
a multi-layer stack, the multi-layer stack comprising a plurality of alternating layers with a multi-layer stack top layer and a spectral filter top layer arranged on the multi-layer stack, the spectral filter top layer comprising
a first spectral purity enhancement layer comprising a first material m1 and having a first layer thickness d1;
an intermediate layer comprising a second material m2 and having a second layer thickness d2, the intermediate layer being arranged on the multi-layer stack top layer, wherein the first spectral purity enhancement layer has an imaginary part of the complex index of refraction k less than or equal to $0.25*n+1.07$, wherein n is the real part of the complex index of refraction.

2. A multi-layer mirror according to claim 1, wherein the spectral filter top layer further comprises a cap layer on top of the first spectral purity enhancement layer, the cap layer comprising a third material selected from Ru, BN, $B_4C$, B, C, TiN, Pd, Rh, Au, $C_2F_4$, SiN, $Si_3N_4$, SiC, $MgF_2$ or LiF.

3. A multi-layer mirror according to claim 1, wherein the spectral filter top layer further comprises a cap layer on top of the first spectral purity enhancement layer, comprising Ru and having a layer thickness d4 between 0.5 and 2.5 nm.

4. A multi-layer mirror according to claim 1, wherein the intermediate layer comprises a metal.

5. A multi-layer mirror according to claim 1, wherein the second material is selected from Be, B, C, Si, P, S, K, Ca, Sc, Br, Rb, Sr, Y, Zr, Nb, Mo, Ba, La, Ce, Pr, Pa or U.

6. A multi-layer mirror according to claim 1, wherein the first spectral purity enhancement layer has a real part of the complex index of refraction equal or larger than 2 and an imaginary part of the complex index of refraction equal or smaller than 1.6.

7. A multi-layer mirror according to claim 1, wherein the first and second materials and the first and second layer thicknesses are configured to minimize absorption and/or destructive interference of radiation having a wavelength selected from a first wavelength range of 5-20 nm, and maximize absorption and/or destructive interference of radiation having a wavelength selected from a second wavelength range of 100-400 nm.

8. A multi-layer mirror according to claim 1, wherein the multi-layer mirror is a normal incidence mirror.

9. A multi-layer mirror according to claim 1, wherein the multi-layer mirror is a normal incidence mirror configured to reflect radiation having a wavelength selected from a first wavelength range of 5-20 mm.

10. A multi-layer mirror according to claim 1, wherein the multi-layer mirror is a normal incidence Si/Mo multi-layer mirror configured to reflect radiation having a wavelength selected from the wavelength range of 12-15 nm.

11. A multi-layer mirror according to claim 1, wherein the first spectral purity enhancement layer comprises $Si_3N_4$, having a layer thickness between 4 and 11 nm, and wherein the intermediate layer comprises Mo having a layer thickness between 1 and 3 nm.

12. A multi-layer mirror according to claim 1, wherein the multi-layer stack top layer comprises a cap layer, the cap layer comprising a material m5 selected from Ru, BN, $B_4C$, B, C, TiN, Pd, Rh, Au, $C_2F_4$, SiN, $Si_3N_4$, SiC, $MgF_2$ or LiF.

13. A multi-layer mirror according to claim 1, wherein the multi-layer stack top layer comprises a cap layer, the cap layer of the multi-layer stack top layer comprising Ru and having a layer thickness d5 between 0.5 and 2.5 nm.

14. The multi-layer mirror according to claim 1, wherein the first material is selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF, the second material comprises a material different from the first material, and d1+d2 has a thickness between 1.5 and 40 nm.

15. A lithographic apparatus comprising a multi-layer mirror comprising a multi-layer stack, the multi-layer stack comprising a plurality of alternating layers with a multi-layer stack top layer and a spectral filter top layer arranged on the multi-layer stack, the spectral filter top layer comprising a first spectral purity enhancement layer comprising a first material m1 and having a first layer thickness d1; an intermediate layer comprising a second material m2 and having a second layer thickness d2, the intermediate layer being arranged on the multi-layer stack top layer, wherein the first spectral purity enhancement layer has an imaginary part of the complex index of refraction k less than or equal to 0.25*n+1.07, wherein n is the real part of the complex index of refraction.

16. A lithographic apparatus according to claim 15, further comprising a plurality of multi-layer mirrors, wherein the first and second material materials and the first and second layer thicknesses are configured to minimize absorption and/or destructive interference of radiation having a wavelength selected from a first wavelength range of 5-20 nm, and maximize absorption and/or destructive interference of radiation having a wavelength selected from a substantial part of the wavelength range of 100-400 nm.

17. The lithographic apparatus according to claim 15, wherein the first material is selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF, the second material comprises a material different from the first material, and d1+d2 has a thickness between 1.5 and 40 nm.

18. A method for enlarging the ratio of radiation having a wavelength selected from a first wavelength range of 5-20 nm and radiation having a wavelength selected from a second wavelength range of 100-400 nm in a beam of radiation of a source emitting radiation in both wavelength ranges, the method comprising reflecting at least part of the beam of radiation on a multi-layer mirror comprising a multi-layer stack, the multi-layer stack comprising a plurality of alternating layers with a multi-layer stack top layer and a spectral filter top layer arranged on the multi-layer stack, the spectral filter top layer comprising a first spectral purity enhancement layer comprising a first material m1 and having a first layer thickness d1; an intermediate layer comprising a second material m2 and having a second layer thickness d2, the intermediate layer being arranged on the multi-layer stack top layer, wherein the first spectral purity enhancement layer has an imaginary part of the complex index of refraction k less than or equal to 0.25*n+1.07, wherein n is the real part of the complex index of refraction.

19. A method according to claim 18, wherein reflecting the at least part of the beam of radiation comprises reflecting the at least part of the beam on a plurality of multi-layer mirrors.

20. A method according to claim 18, wherein the first and second materials and the first and second layer thicknesses are configured to minimize absorption and/or destructive interference of radiation having a wavelength selected from the first wavelength range, and maximize absorption and/or destructive interference of radiation having a wavelength selected from the second wavelength range of 100-400 nm.

21. The method according to claim 18, wherein the first material is selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF, the second material comprises a material different from the first material, and d1+d2 has a thickness between 1.5 and 40 nm.

22. A device manufacturing method, comprising:
providing a beam of radiation;
patterning the beam of radiation;
projecting the patterned beam of radiation onto a target portion of a substrate;
enlarging the ratio of radiation having a wavelength selected from a first wavelength range of 5-20 nm and radiation having a wavelength selected from a second wavelength range of 100-400 nm by reflecting at least part of the beam of radiation on a multi-layer mirror comprising a multi-layer stack, the multi-layer stack comprising a plurality of alternating layers with a multi-layer stack top layer and a spectral filter top layer arranged on the multi-layer stack, the spectral filter top layer comprising a first spectral purity enhancement layer comprising a first material m1 and having a first layer thickness dl; an intermediate layer comprising a second material m2 and having a second layer thickness d2, the intermediate layer being arranged on the multi-layer stack top layer, wherein the first spectral purity enhancement layer has an imaginary part of the complex index of refraction k less than or equal to 0.25*n+1.07, wherein n is the real part of the complex index of refraction.

23. The device manufacturing method according to claim 22, wherein the first material is selected from SiN, $Si_3N_4$, $SiO_2$, ZnS, Te, diamond, CsI, Se, SiC, amorphous carbon, $MgF_2$, $CaF_2$, $TiO_2$, Ge, $PbF_2$, $ZrO_2$, $BaTiO_3$, LiF or NaF, the second material comprises a material different from the first material, and d1+d2 has a thickness between 1.5 and 40 nm.

* * * * *